(12) United States Patent
Suga

(10) Patent No.: US 8,913,841 B2
(45) Date of Patent: Dec. 16, 2014

(54) IMAGE PROCESSING METHOD FOR MASS SPECTRUM IMAGE, PROGRAM, AND APPARATUS

(75) Inventor: Takeo Suga, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 112 days.

(21) Appl. No.: 13/574,129

(22) PCT Filed: Feb. 14, 2011

(86) PCT No.: PCT/JP2011/053584
§ 371 (c)(1),
(2), (4) Date: Jul. 19, 2012

(87) PCT Pub. No.: WO2011/102496
PCT Pub. Date: Aug. 25, 2011

(65) Prior Publication Data
US 2012/0301045 A1 Nov. 29, 2012

(30) Foreign Application Priority Data
Feb. 17, 2010 (JP) ................ 2010-032365

(51) Int. Cl.
G06K 9/40 (2006.01)
H01J 37/28 (2006.01)
H01J 49/00 (2006.01)
G06T 5/00 (2006.01)
H01J 37/05 (2006.01)
G06T 5/20 (2006.01)
H01J 37/22 (2006.01)

(52) U.S. Cl.
CPC ....... *H01J 37/28* (2013.01); *G06T 2207/30024* (2013.01); *G06T 2207/20008* (2013.01); *H01J 49/0036* (2013.01); *G06T 5/003* (2013.01); *H01J 49/0004* (2013.01); *G06T 2207/10061* (2013.01); *H01J 37/05* (2013.01); *G06T 5/20* (2013.01); *H01J 37/22* (2013.01)
USPC ............................ 382/255; 382/128; 382/133

(58) Field of Classification Search
CPC .......... H04N 5/23312; H04N 5/23248; H04N 5/23254; H04N 5/23258; G01N 2021/6471; G02B 27/0025
USPC ............... 382/128, 133, 255; 250/201.9, 216; 359/16, 900; 399/296, 313; 356/520, 356/521; 606/3, 10, 12, 7, 15, 16
See application file for complete search history.

(56) References Cited
U.S. PATENT DOCUMENTS 3,713,730 A * 1/1973 Kaplan .................. 382/255
5,196,004 A * 3/1993 Sinofsky ................ 606/3

(Continued)

FOREIGN PATENT DOCUMENTS

JP 4-341741 A 11/1992
JP 2008-177064 A 7/2008

OTHER PUBLICATIONS

Aug. 30, 2012 Notification Concerning Transmittal of the Aug. 21, 2012 International Preliminary Report on Patentability (PCT/IB/326) issued in counterpart PCT Application No. PCT/JP2011/053584 filed Feb. 14, 2011.
Aug. 21, 2012 International Preliminary Report on Patentability (PCT/IB/373) issued in counterpart PCT Application No. PCT/JP2011/053584.
Apr. 5, 2011 Written Opinion of the International Searching Authority (PCT/ISA/237).
U.S. Appl. No. 13/576,574, filed Aug. 1, 2012, Takeo Suga.
European Search Report dated Sep. 16, 2013, in counterpart European Application No. 11744782.1-1906 /2537174.

(Continued)

*Primary Examiner* — Anh Do
(74) *Attorney, Agent, or Firm* — Fitzpatrick, Cella, Harper & Scinto

(57) ABSTRACT

Image blurring of a mass spectrum image obtained by the signal intensity for each mass/charge ratio from the obtained two-dimensional mass spectrum is reduced by image restoration using a blurring function. The blurring function expresses a two dimensional distribution of transferred energy related to the distance from a point of primary ion incidence limited by a region exceeding desorption energy of a molecule.

14 Claims, 14 Drawing Sheets

(56) References Cited

U.S. PATENT DOCUMENTS

| | | | |
|---|---|---|---|
| 5,263,951 A * | 11/1993 | Spears et al. | 606/12 |
| 6,233,056 B1 * | 5/2001 | Naulleau et al. | 356/520 |
| 8,106,357 B2 | 1/2012 | Nakahira et al. | |
| 8,107,705 B2 * | 1/2012 | Dowski et al. | 382/128 |
| 2008/0251719 A1 | 10/2008 | Nakahira et al. | |

OTHER PUBLICATIONS

D. Rading, et al., "Secondary ion emission from molecular overlayers: Thiols on gold," J. Vac. Sci. Technol. A 18(2), Apr. 18, 2000, 2000 American Vacuum Society, pp. 312-319.

Apr. 5, 2011 International Search Report in PCT/JP2011/053584.

* cited by examiner

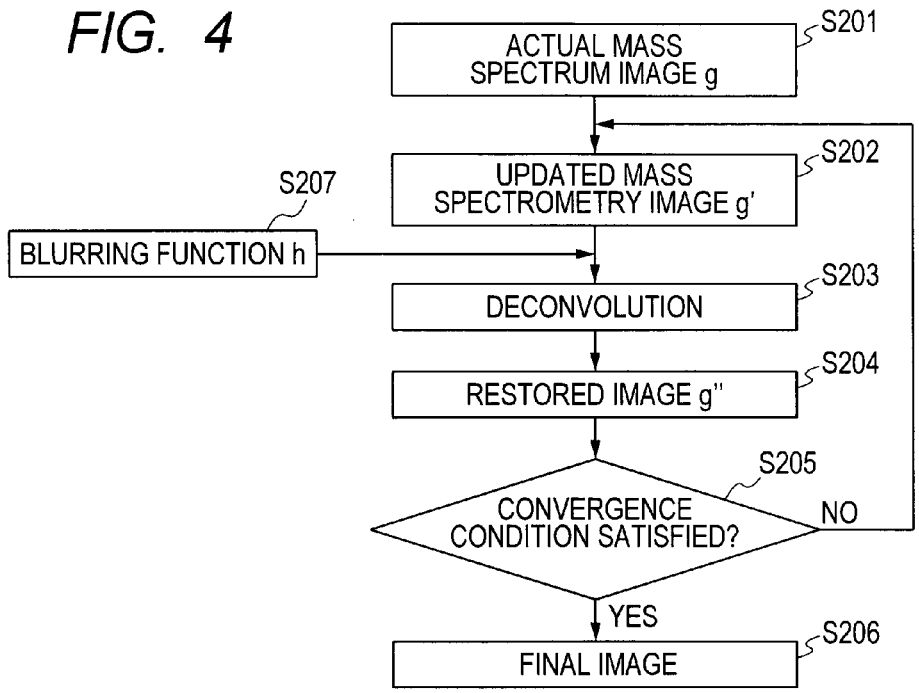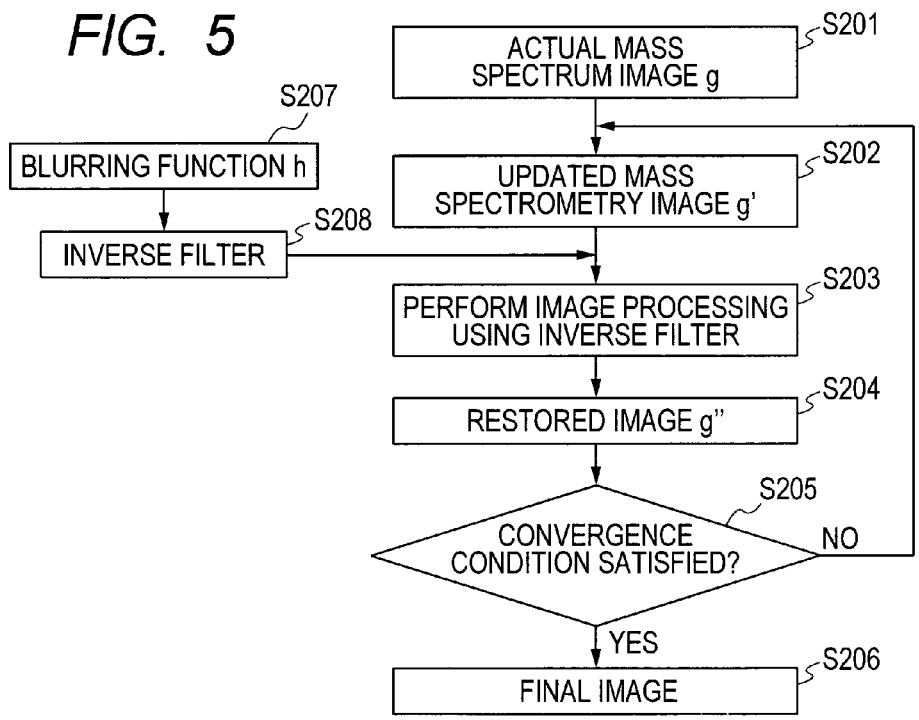

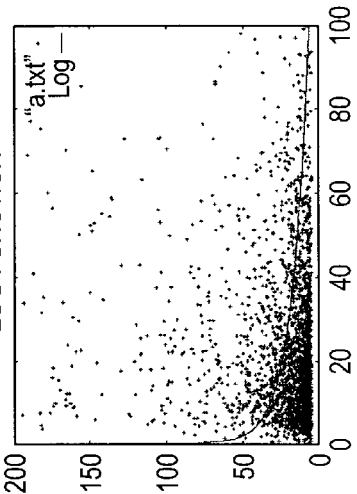
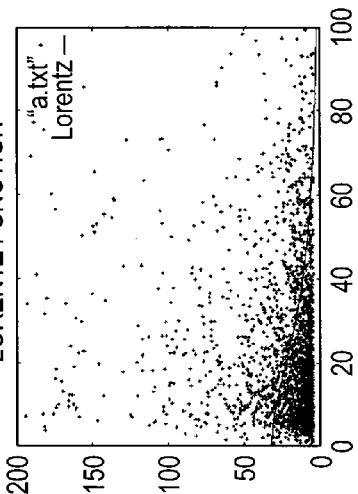
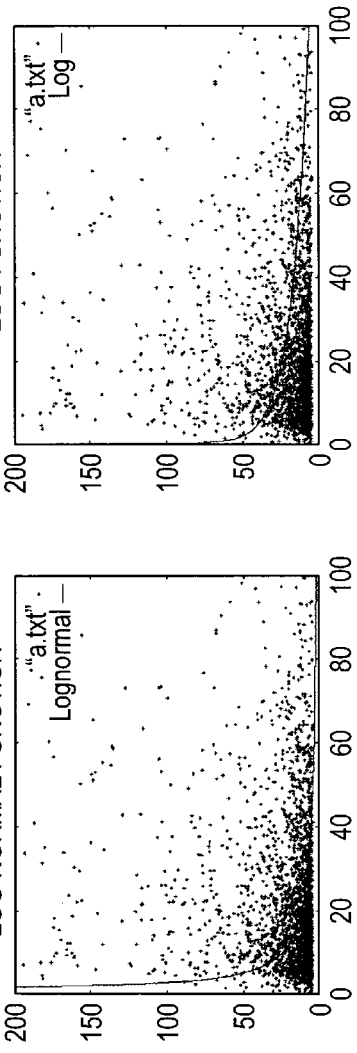
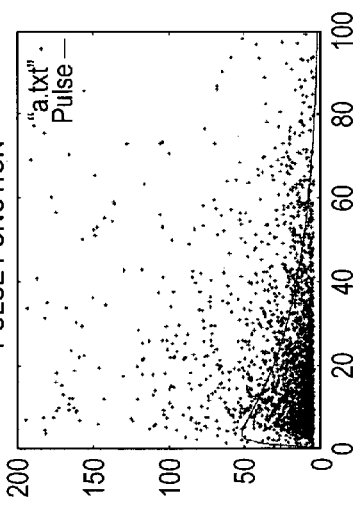

FIG. 19
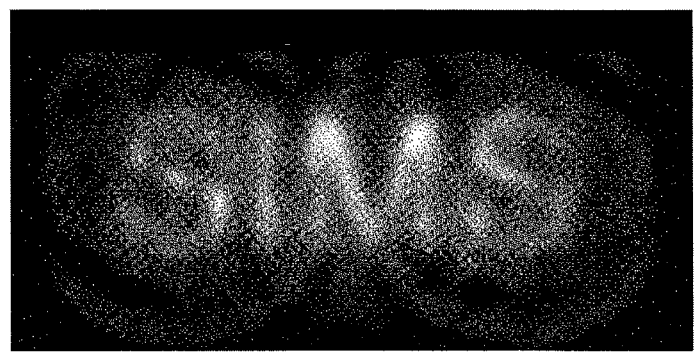
FIG. 20
FIG. 21
|  | BLURRED IMAGE 18 AND ORIGINAL IMAGE 20 | RESTORED IMAGE 19 AND ORIGINAL IMAGE 20 |
|---|---|---|
| CROSS-CORRELATION COEFFICIENT | 0.55 | 0.73 |

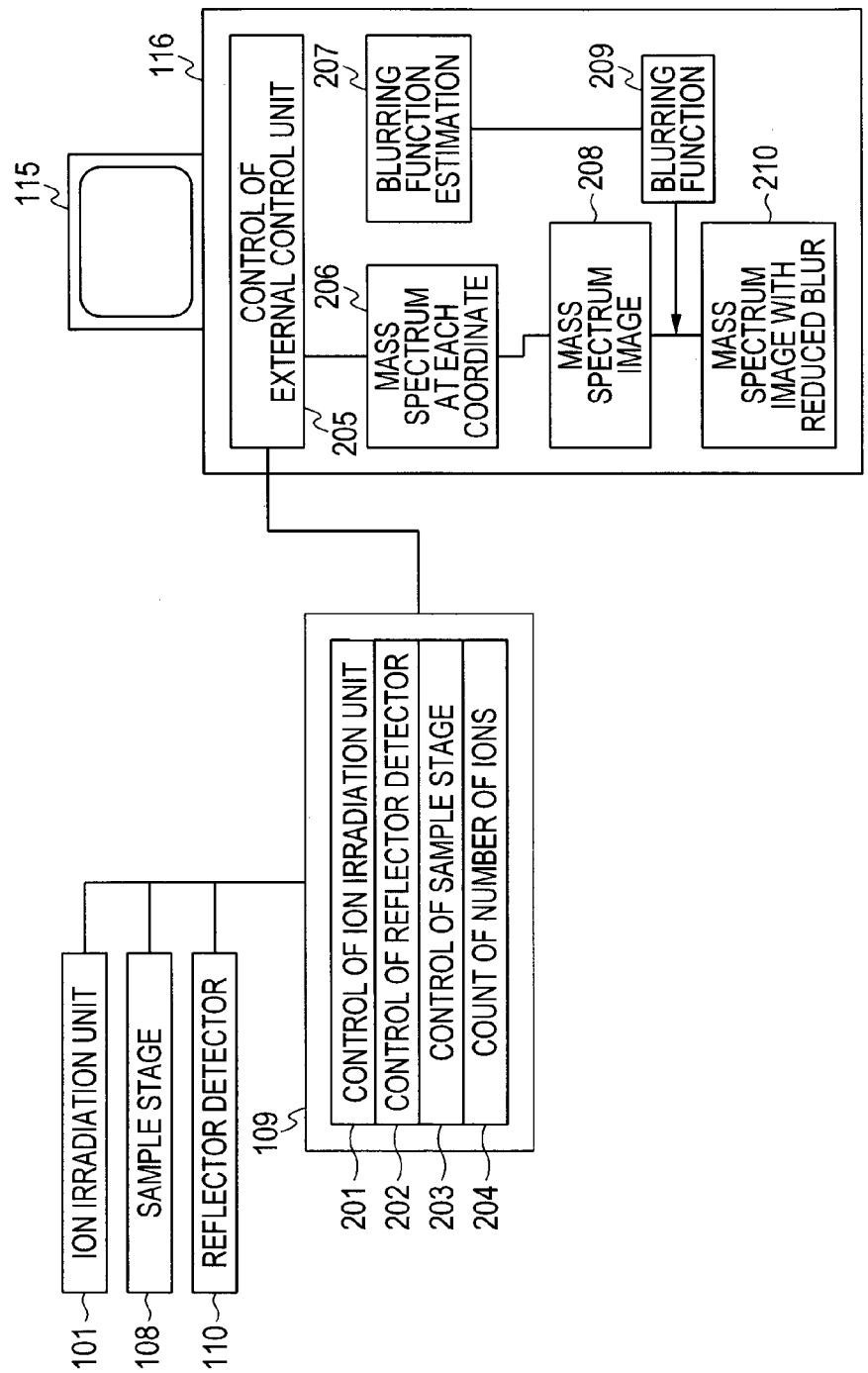

IMAGE PROCESSING METHOD FOR MASS SPECTRUM IMAGE, PROGRAM, AND APPARATUS

TECHNICAL FIELD

The present invention relates to an image processing method for an image acquired by a mass spectrometer, a program, and an apparatus.

BACKGROUND ART

In the field of proteomic analysis and pathological examination, there is emerging a new analytical method for completely visualizing a protein expressed in a tumor tissue and the like on a cellular level.

Mass spectrometry is one of the most effective methods to visualize the inner structure of a cell. In mass spectrometry, laser desorption/ionization (LDI) and matrix assisted laser desorption/ionization (MALDI) methods have been widely used in recent years as an ionization method in the life science field because of its capability of suppressing the cleavage of a high molecular compound with a large molecular weight. According to the above ionization methods, a laser beam irradiates a sample to promote charge movement inside a substance absorbing the laser beam for ionization. The ionized molecules are analyzed by an analyzing unit such as a time-of-flight mass spectrometer to detect the mass/charge (m/Z) ratio. The mass spectrometry using these ionization methods can acquire a component distribution while moving the laser irradiation position on a surface of sample. The obtained fine and two-dimensional mass spectrum is called a mass spectrum image. This imaging is a promising means for obtaining a protein distribution in a cell.

Secondary ion mass spectrometry (SIMS) is an analysis method of obtaining a two-dimensional mass spectrum by ionizing atoms and molecules by irradiating a sample with primary ions. The SIMS is classified into a dynamic-SIMS and a static-SIMS based on the difference in amount of primary ion irradiation. The dynamic-SIMS sputters a sample surface with a large amount of primary ion irradiation to generate a large amount of secondary ions. In contrast to this, the static-SIMS uses the amount of primary ion irradiation sufficiently smaller than the number of molecules composing the surface to generate secondary ions maintaining the molecular structure. This method is more advantageous in analyzing organic compounds than the dynamic-SIMS since abundant information about the molecular structure can be obtained. The SIMS can also form a mass spectrum image by performing mass spectrometry while moving the position of primary ion irradiation.

The present inventors have proposed various methods based on high spatial resolution time-of-flight secondary ion mass spectrometry (TOF-SIMS method) which is a kind of static-SIMS, such as a method of decomposing the surface layer of a body tissue section by digestive enzyme and measuring the two-dimensional distribution of the generated peptide fragments and a method of detecting a minute amount of body-related substance using a SIMS-specific sensitizer.

Note that a present mass spectrum image is obtained by integrating a desired signal intensity vs mass/charge from a mass spectrum obtained at each position on the sample and simply two-dimensionally displaying the integrated signal intensity at each position.

In general, an image acquired by an apparatus is a blurred one depending on the instrument for observation and the object to be observed. An image having a blur is called a blurred image or a deteriorated image. For example, in an optical system having a lens such as a microscope, a telescope or a digital camera, image blurring is caused by distortion, lens aberration, and an out-of-focus state.

In order to reduce image blurring, an image restoration algorithm is generally used. More specifically, the cause of image blurring is treated as a function and numerical processing is performed thereon to reduce image blurring. Here, a function defining the cause of image blurring is referred to as "blurring function". For example, in the above described image restoration method for blurred images in a light microscope, image restoration is generally performed by using a preliminarily measured point spread function of lens as a blurring function.

Japanese Patent Application Laid-Open No. 2008-177064 (PTL1) discloses a method of performing restoration of an image obtained by a scanning electron microscope and a scanning ion microscope by calculating a blurring function according to the imaging condition such as an accelerating voltage, a beam aperture angle, a beam current, or a focus position. Further, an effect of charged-particle beam diffusion in the sample on image blurring is considered.

The mass spectrometry imaging also generates image blurring. However, the image blurring is generated not only for the same reason as a general microscope, but also by a the cause specific to the mass spectrometry. More specifically, the SIMS uses sputtering phenomena and thermal desorption phenomena. Therefore, image blurring occurs by a cause depending on primary ions, such as ionic species and energy, as well as by a cause depending on atoms and molecules to be observed.

When a macromolecule such as a protein is ionized by primary ion irradiation, the molecules are ionized with their molecular structure intact or fragmented. Whether fragmentation occurs or not, depends on the distance from the position of primary ion incidence. The detailed description of this phenomenon is found in "D. Rading, et al, J. Vac. Sci. Technol., A vol. 18, p. 312 (2000)" (NPL1).

CITATION LIST

Patent Literature

PTL1: Japanese Patent Application Laid-Open No. 2008-177064

Non-Patent Literature

NPL1: D. Rading, et al, J. Vac. Sci. Technol., A vol. 18, p. 312 (2000)

SUMMARY OF INVENTION

Technical Problem

In general, image restoration is performed to reduce blur in a microscopy image. However, image blurring occurs in SIMS by a cause different from that for general image blurring. Therefore, a conventional blurring function cannot effectively reduce blur in SIMS.

An object of the present invention is to provide a method of reducing image blurring in SIMS and further determine such a blurring function.

Solution to Problem

The present invention has succeeded in restoring a mass spectrum image using a blurring function minutely considering physical phenomena of energy transfer from primary ions and desorption of secondary ions. Such a concept has never existed before.

More specifically, the present invention provides an image processing method for a mass spectrum image using secondary ion mass spectrometry by which transferred energy is expressed as a radial function related to the distance from a point of primary ion incidence and the radial function is expressed as a two-dimensional (2D) distribution function and is used as a blurring function in a region exceeding desorption energy of a molecule.

Advantageous Effects of Invention

The image processing method for a mass spectrum image according to the present invention can reduce image blurring of a mass spectrum image and provide a clear image using an estimated blurring function for image restoration.

BRIEF DESCRIPTION OF DRAWINGS

FIG. 4 illustrates a step of performing image processing on the mass spectrum image.

FIG. 5 illustrates a step of performing image processing on the mass spectrum image.

FIG. 8A illustrates a result of fitting a radial distribution function of transferred energy to each number function.

FIG. 8B illustrates a result of fitting a radial distribution function of transferred energy to each number function.

FIG. 8C illustrates a result of fitting a radial distribution function of transferred energy to each number function.

FIG. 8D illustrates a result of fitting a radial distribution function of transferred energy to each number function.

FIG. 19 illustrates a restored image.

FIG. 20 illustrates an original image.

FIG. 21 illustrates a result of examining an image restoration effect.

FIG. 24 illustrates a time-of-flight secondary ion mass spectrometer.

DESCRIPTION OF EMBODIMENTS

Figure 1A:
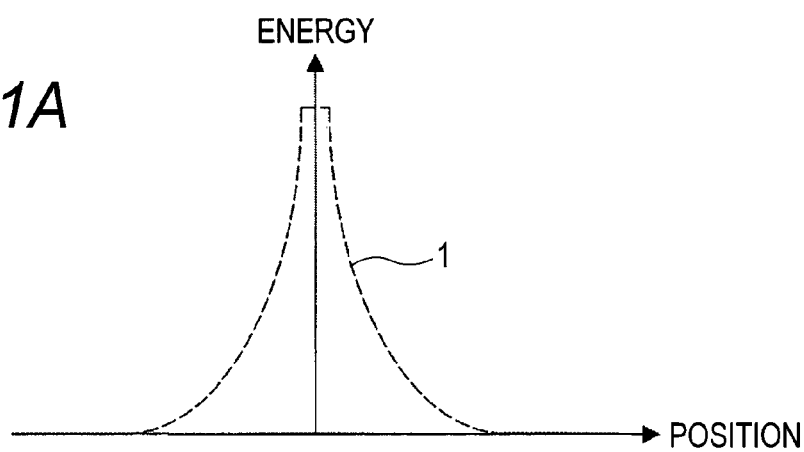
FIG. 1A is a drawing illustrating transferred energy with a cutoff on an outer circumference.

The present invention provides an image processing method for a mass spectrum image using secondary ion mass spectrometry by which transferred energy is expressed as a radial function related to a distance from a point of primary ion incidence and the radial function is expressed as a 2D distribution function in a region exceeding desorption energy of a molecule, and this function is used as a blurring function to reduce image blurring of the mass spectrum image.

Secondary ion mass spectrometry (SIMS) refers to an analysis method of obtaining a mass spectrometry by irradiating a sample with primary ions whose irradiation position is controlled to ionize atoms and molecules in the sample. The ionized atoms and molecules in the sample are referred to as secondary ions. In the present invention, one primary ion or a plurality of same species of primary ions may be emitted.

The mass spectrum image refers to an image which integrates a desired signal intensity vs mass/charge from a mass spectrum obtained at each position on a sample and two-dimensionally displays the integrated signal intensity at each position.

The transferred energy in the present invention refers to an energy transferred to a sample or a substrate by primary ion irradiation. The transferred energy can be expressed as a radial function related to the distance from the incidence point. In the above invention, any radial function may be used such as a linear fractional function, a log-normal function, a log function, a pulse function, or a Lorentz function.

The 2D distribution function is expressed as an x-y two-dimensional plane with its origin at the incidence point and can be obtained by assigning $a/(x^2+y^2)^{n/2}$ (a is a constant greater than 0 and n is a constant equal to or greater than 0.8 and equal to or less than 1.2) to the distance of the radial distribution function from the incident point.

The desorption energy of a molecule refers to an energy required for a secondary ion to desorb and can also be approximated by adsorption energy.

The blurring function refers to a cause of image blurring expressed as a function. The region exceeding the desorption energy of the molecule refers to a region in which the transferred energy is higher than the desorption energy. In the present invention, the radial function in the region in which the transferred energy exceeds the desorption energy of the molecule is expressed as a 2D distribution function which is used as a blurring function. Alternatively, the radial function in a region exceeding desorption energy of the molecule and excluding a transferred energy portion higher than the bond dissociation energy of a bond composing the sample molecule is expressed as a 2D distribution function and this function may be used as the blurring function.

Further, the present invention provides a program for causing a computer to execute: a first step of inputting an ionic species of a primary ion, an electric charge, an accelerating voltage, and a substrate type; a second step of executing Monte Carlo simulation based on a parameter inputted in the first step; a third step of generating a table representing a relationship between a distance from a point of primary ion incidence and transferred energy from a result obtained in the second step; a fourth step of specifying a preset function; a fifth step of fitting the distance and the transferred energy obtained in the third step by the function specified in the fourth step; a sixth step of cutting off a function fitted by energy lower than desorption energy of a molecule; a seventh step of cutting off a function fitted by energy higher than bond dissociation energy of the molecule; an eighth step of converting the fitted function obtained in the fifth step to a 2D distribution function; a ninth step of storing the 2D distribution function obtained in the eighth step as a blurring function; a tenth step of obtaining a mass spectrum at each coordinate; an eleventh step of specifying m/z in a specific range; a twelfth step of extracting a specified intensity of m/z from the mass spectrum at each coordinate and storing the intensity as a mass spectrum image; a thirteenth step of performing image restoration on the blurring function stored in the ninth step and the mass spectrum image stored in the twelfth step; a fourteenth step of storing the restored image obtained in the thirteenth step; and a fifteenth step of displaying the restored image stored in the fourteenth step. Hereinafter, the present invention will be described in more detail by referring to embodiments. The following embodiments are an example of exemplary embodiments according to the present invention, but the present invention is not limited to these specific embodiments.

EMBODIMENTS

First Embodiment

Figure 2:
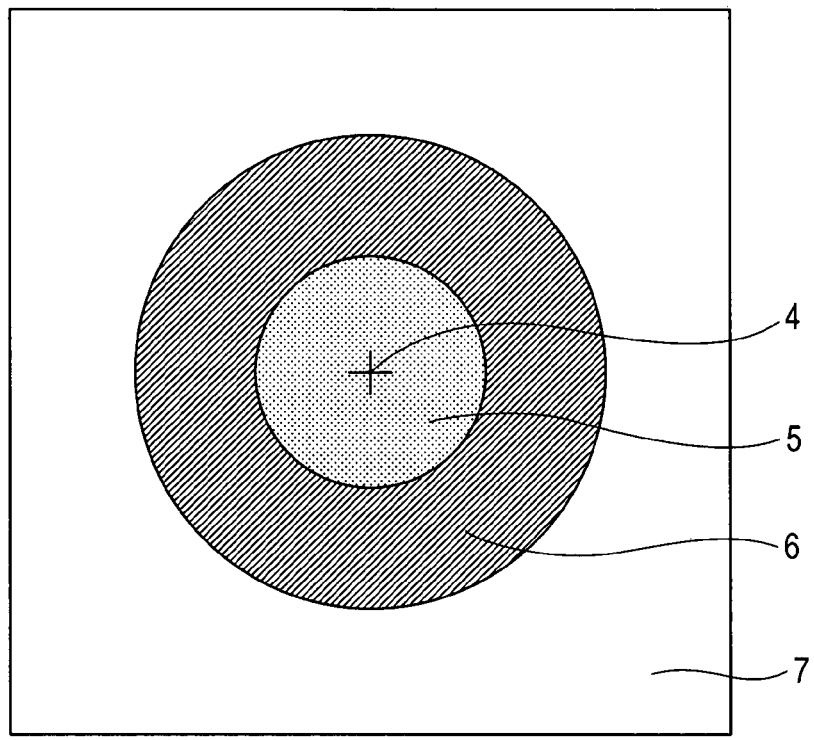
FIG. 2 is a drawing illustrating a secondary ion generation region.

Considering ionizing mechanism of a molecule by a primary ion, the region of secondary ion generation can be divided into three regions. More specifically, as illustrated in FIG. 2, the three regions are: a region 5 which is located near a position of primary ion incidence with a position of primary ion incidence 4 at the center and in which fragmented ions are desorbed; a region 6 which is located far from the position of primary ion incidence in which a molecule is ionized and desorbed with its molecular structure intact; and a region 7 which is not affected by primary ions and in which a sample molecule is not desorbed as secondary ions.

These regions depend on the energy transferred from a primary ion to a substrate, the desorption energy of the molecule, and the bond dissociation energy of the molecule. Of them, the energy transferred from a primary ion to a substrate affects the intensity and the region of the energy transfer. Further, the desorption energy of the sample molecule determines the region of secondary ion generation. Furthermore, the bond dissociation energy of the molecule determines the region of both fragmentation of molecule and its secondary ion generation.

Figure 3:
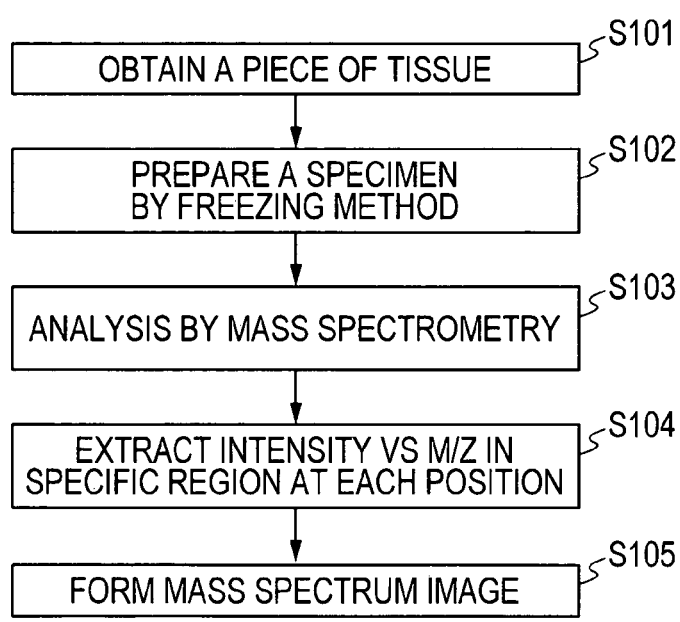
FIG. 3 illustrates a step of performing mass spectrometry on an observation sample using TOF-SIMS and forming a mass spectrum image.

FIG. 3 illustrates an example from performing mass spectrometry imaging by TOF-SIMS. First, in step S101, a piece of tissue is obtained. Then in step S102, a thin section is prepared from it by frozen section technique. Subsequently, in step S103, the thin section is inserted into a sample chamber of TOF-SIMS and mass spectrometry is performed thereon. Then, in step S104, the intensity vs mass/charge in a specific region is extracted from the obtained mass spectra. Then, in step S105, a mass spectrum image is formed.

When a macromolecule such as a protein is ionized by primary ion irradiation, a molecule is ionized with its molecular structure intact or fragmented. In a mass spectrum image for the purpose of analyzing such a macromolecule, the position of primary ion irradiation does not match the region of ionization with its molecular structure intact, and thus image blurring occurs. The obtained image g can be expressed by the following mathematical expression using true image f, blurring function h, and noise n.

$$g = h*f + n \qquad \text{(Expression 1)}$$

In order to reproduce the original structure, the true image f needs to be estimated from the obtained mass spectrum image g.

For this estimation, deconvolution can be used as illustrated by the schematic drawing of steps in FIG. 4. The mass spectrum image obtained in S201 and the blurring function obtained in S207 are used to perform deconvolution (S203) to obtain a restored image (S204). In step S205, a determination is made as to whether or not deconvolution is performed a specified number of times. If not, the steps from S202 to S204 are repeated until the condition is satisfied. Finally, a final image is output (S206).

The similar effect of the image restoration can be obtained in such a manner that as illustrated by the schematic drawing of steps in FIG. 5, an inverse function of the blurring function is obtained (S207) and this function is used as an inverse filter (S208).

The blurring function is determined by the primary ion transferred energy, the desorption energy of the molecule, and the bond dissociation energy.

Figure 6:
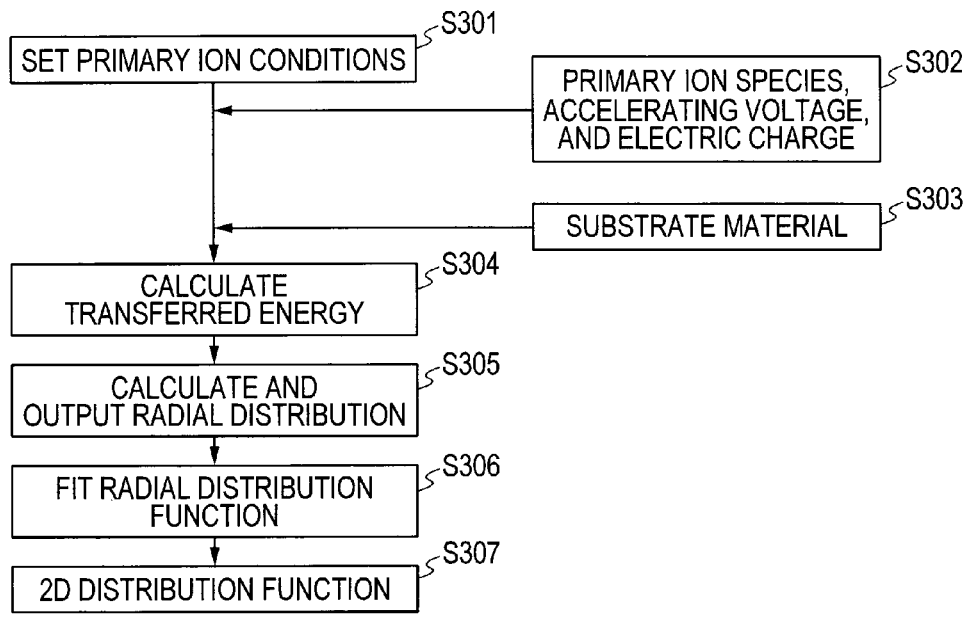
FIG. 6 illustrates a step of obtaining a 2D distribution function.
Figure 7:
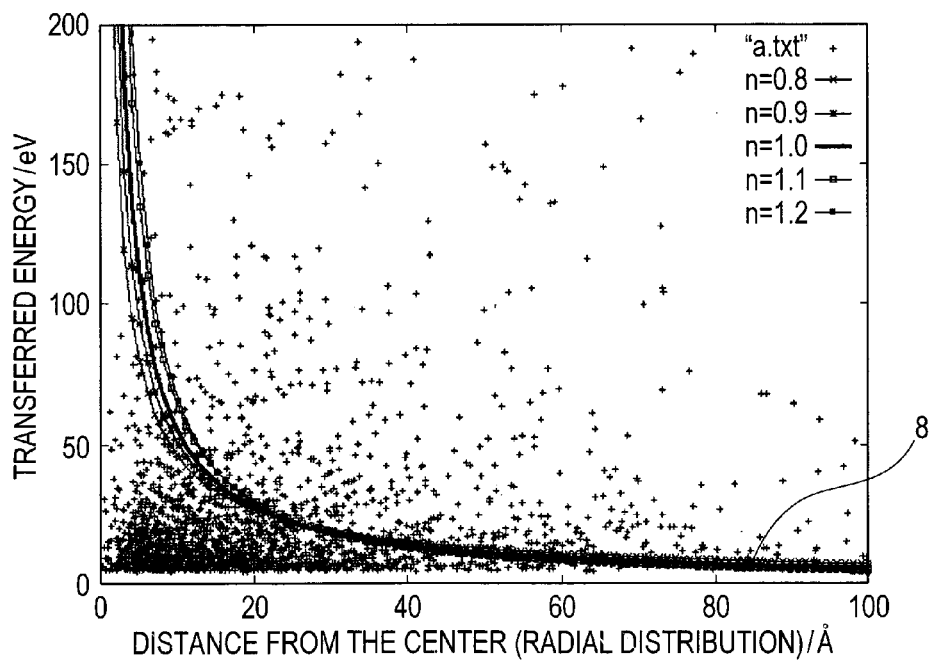
FIG. 7 illustrates a result of fitting a radial distribution function of transferred energy to a linear fractional function.

The energy transferred from the primary ion to the sample can be calculated by ion irradiation simulation using parameters of the primary ion species, the electric charge, the accelerating voltage, and the substrate material. The ion irradiation simulation is illustrated in FIG. 6. The above calculation produces a radial distribution function (step S306) which is an outer shape of the transferred energy. FIG. 7 plots a radial distribution of the transferred energy calculated by the simulation. The farther away from the ion incident position, the less the transferred energy. Thus, the transferred energy can be expressed as an expression f(r) representing the relation between the transferred energy E and the distance r from the incidence point and can be fitted by a linear fractional function expressed by the following expression. Note that "a" denotes a constant.

$$E = f(r) = \frac{a}{r^n} \qquad \text{Math. 1}$$

The fitted results are illustrated by a solid line 8 in FIG. 7. It is understood from the fitted results that "n" is preferably equal to or greater than 0.8 and equal to or less than 1.2. The maximum transferred energy is $(½)mv^2$. Here, "m" denotes the mass of a primary ion and "v" denotes the velocity thereof. In other word, the value of f(r) is cut off at $(½)mv^2$. The 2D distribution function can be obtained by assigning $r = (x^2+y^2)^{1/2}$ to f(r).

Note that the fitting function may be any appropriate function not only the function expressed by the expression (2,) but also the log-normal function, the log function, the pulse function, the Lorentz function, and the like.

Log-normal function $$f(r) = \frac{A}{\sigma x \sqrt{2\pi}} e^{-\frac{(\ln r - \mu)^2}{2\sigma^2}} \quad \text{Math. 2}$$

Log function $$f(r) = a - b\ln(r + c) \quad \text{Math. 3}$$

Pulse function $$f(r) = A\left(1 - e^{-\frac{r-r0}{t1}}\right)^p e^{-\frac{r-r0}{t2}} \quad \text{Math. 4}$$

Lorentz function $$f(r) = \frac{2A}{\pi} \frac{w}{4r^2 + w^2} \quad \text{Math. 5}$$

These fitting results are illustrated in FIGS. 8A-8D.

Figure 9:
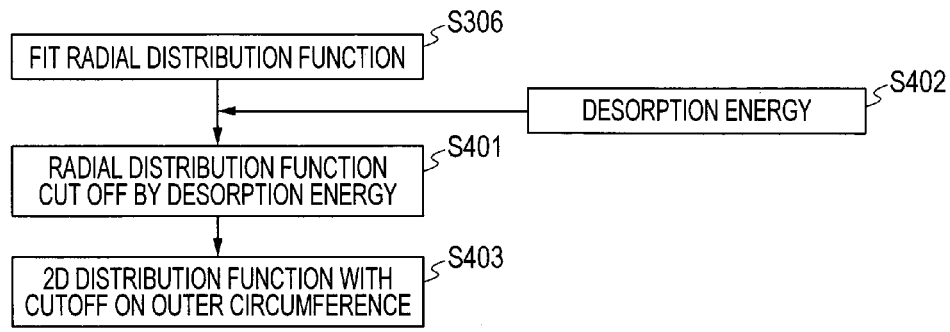
FIG. 9 illustrates a step of obtaining the 2D distribution function of transferred energy with a cutoff on the outer circumference.

The steps illustrated in FIG. 9 define a secondary ion desorbing region in the 2D distribution function. The energy equal to or greater than the desorption energy is necessary to release a secondary ion. The farther away from the position of primary ion incidence, the less the energy transfer by the primary ion is. Therefore, in a range farther away from the point of primary ion incidence, no secondary ion desorption occurs since the region corresponds to the region 7 in which only energy less than the desorption energy S402 can be transferred. The generation area of secondary ion is restricted by the desorption energy S402. The desorption energy S402 may be approximated by adsorption energy and the value is generally greater than 0 eV and up to 10 eV. More specifically, the secondary ion desorption distribution becomes a function S403 cut off in a region smaller than the desorption energy S402, of the entire space of the fitted radial distribution function. This distribution can be used as the blurring function.

Figure 1B:
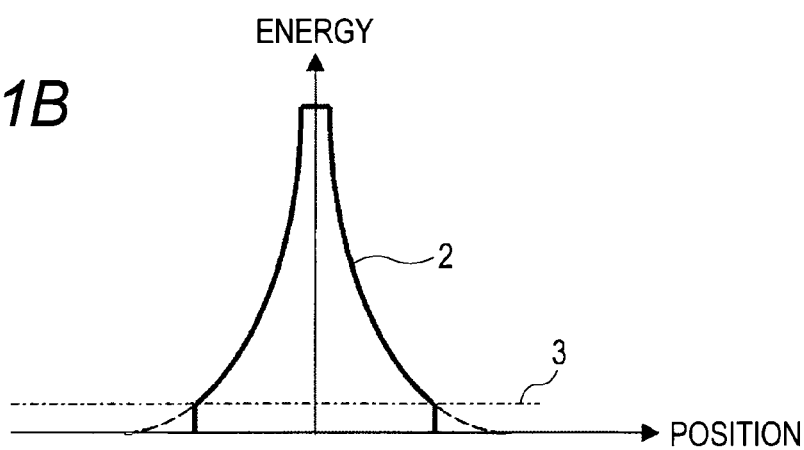
FIG. 1B is a drawing illustrating transferred energy with a cutoff on an outer circumference.

The cross section of a radial distribution function cut off by desorption energy is illustrated in FIGS. 1A and 1B. More specifically, a radial distribution function 1 obtained by fitting (FIG. 1A) is cut off by energy lower than a desorption energy 3 and the region outside thereof is 0 (FIG. 1B). Thus, a radial distribution function 2 is obtained.

Figure 10:
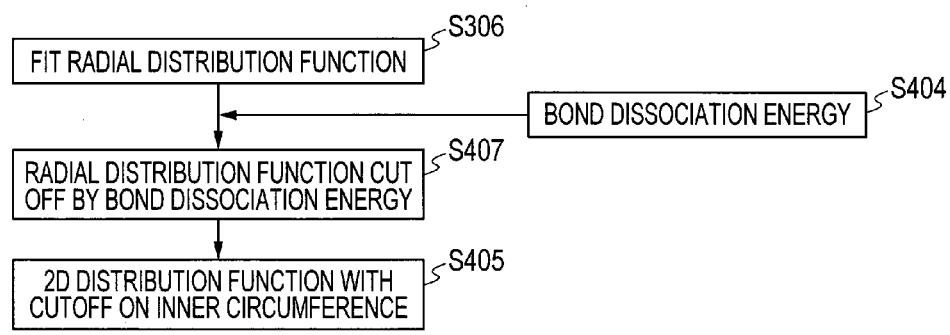
FIG. 10 illustrates a step of obtaining the 2D distribution function of transferred energy with a cutoff on an inner circumference.

Further, the steps illustrated in FIG. 10 define the region in which a secondary ion is fragmented.

In a region in which the energy transferred by primary ion incidence is larger than the bond dissociation energy S404 of a molecule, both ionized and fragmented molecules are detected. The region 6 is an area of less transferred energy than that of the fragmenting region and is ionized with its molecular structure intact. The bond dissociation energy of the molecule is generally equal to or greater than 1 eV and equal to or less than 30 eV. That is, a radial distribution function 5407 cuts off in a region of higher energy than that of the bond dissociation energy S404 in the entire region of the fitted radial distribution function. The 2D distribution function 5405 is obtained from the radial distribution function 5407.

Figure 11:
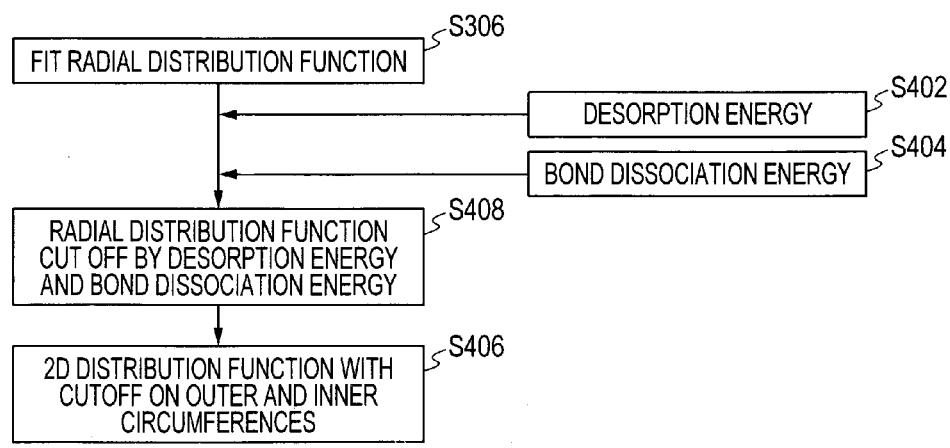
FIG. 11 illustrates a step of obtaining the 2D distribution function of transferred energy with a cutoff on the outer and inner circumferences.

As illustrated by the steps in FIG. 11, when both the desorption energy S402 and the bond dissociation energy S404 are defined, a radial distribution function 5408 is cut off by them. From this radial distribution function, the region 6 in which an intact molecule is ionized and desorbed is determined and becomes a 2D distribution function 5406 with a cutoff on the outer circumference and the inner one.

Figure 12A:
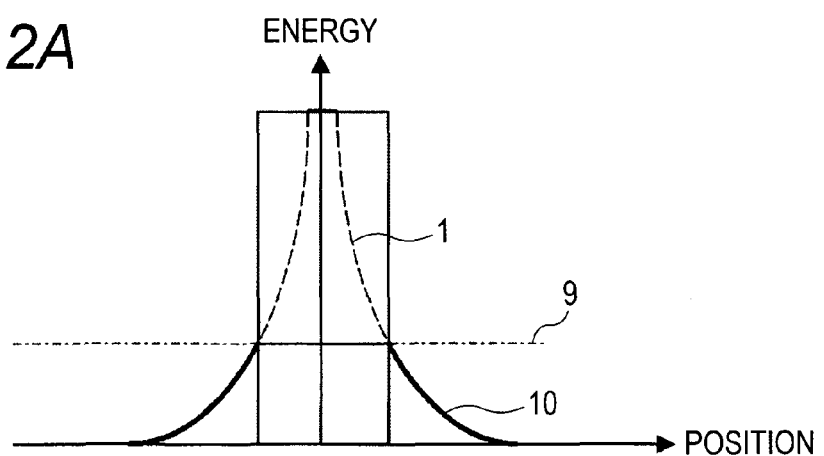
FIG. 12A is a cross section of a radial distribution function of the transferred energy cut off by energy higher than bond dissociation energy.
Figure 12B:
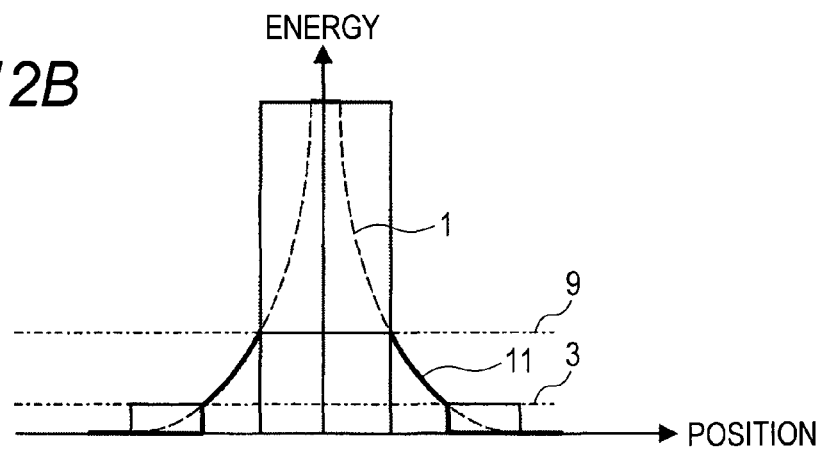
FIG. 12B is a cross section of a radial distribution function of the transferred energy cut off by desorption energy and the bond dissociation energy.

The cross section of the radial distribution function obtained in steps in FIGS. 10 and 11 is illustrated in FIGS. 12A and 12B respectively. FIG. 12A illustrates the cross section of the radial distribution function 1. The radial distribution function 1 obtained by fitting is cut off by the energy higher than the bond dissociation energy 9 and the region inside thereof is 0. Thus, a radial distribution function 10 is obtained.

Like FIG. 12A, FIG. 12B illustrates a radial distribution function 11 whose region is cut off by the desorption energy 3 and the bond dissociation energy 9. In this case, the desorption energy needs to be less than the fragmentation energy.

Figure 13:
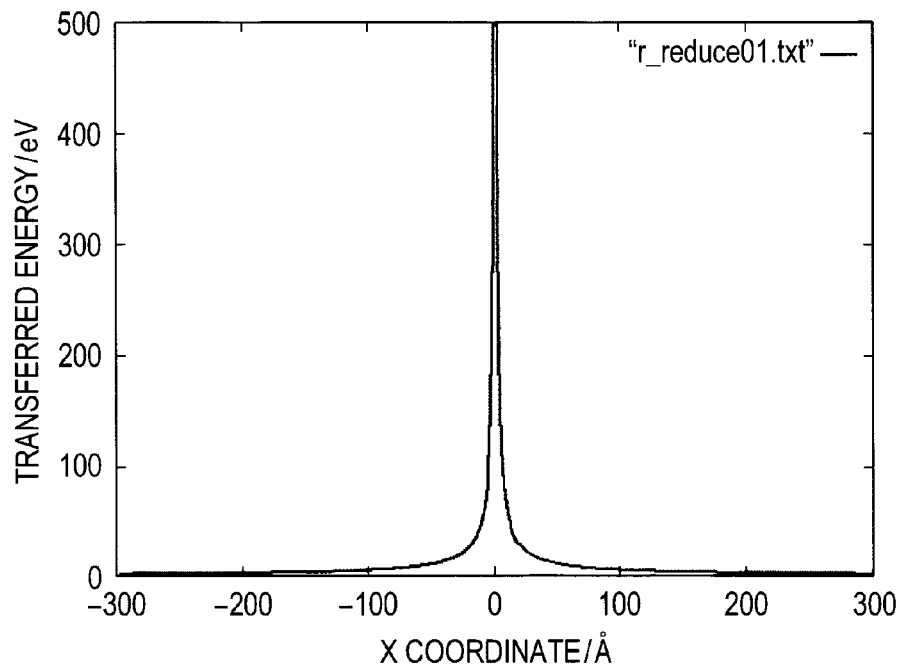
FIG. 13 is a cross section of the radial distribution function of the transferred energy.

Here, consider a case in which mass spectrometry is performed on an insulin existing on a silicon substrate with Ga+ ion accelerated at 10 kV. First, the radial distribution function of the blurring function is determined based on FIG. 6. The calculation of transferred energy can be executed by software for simulating ion flight with respect to a solid substance. Typical software is the Stopping and Range of Ions in Matter (SRIM). FIG. 7 plots the kinetic energy of a silicon atom generated when the silicon substrate is irradiated with Ga+ ion accelerated at 10 kV. The horizontal axis indicates the distance from a position of primary ion incidence and the vertical axis indicates the kinetic energy of a silicon atom. This plot is fitted with a/r to produce $E=f(r)=549/r$. When the radial distribution function is calculated from this result, $E(r)=549/(x^2+y^2)^{1/2}$ is obtained as described above (here, x and y are plane coordinates). Its cross-sectional profile is as illustrated in FIG. 13.

Figure 14:
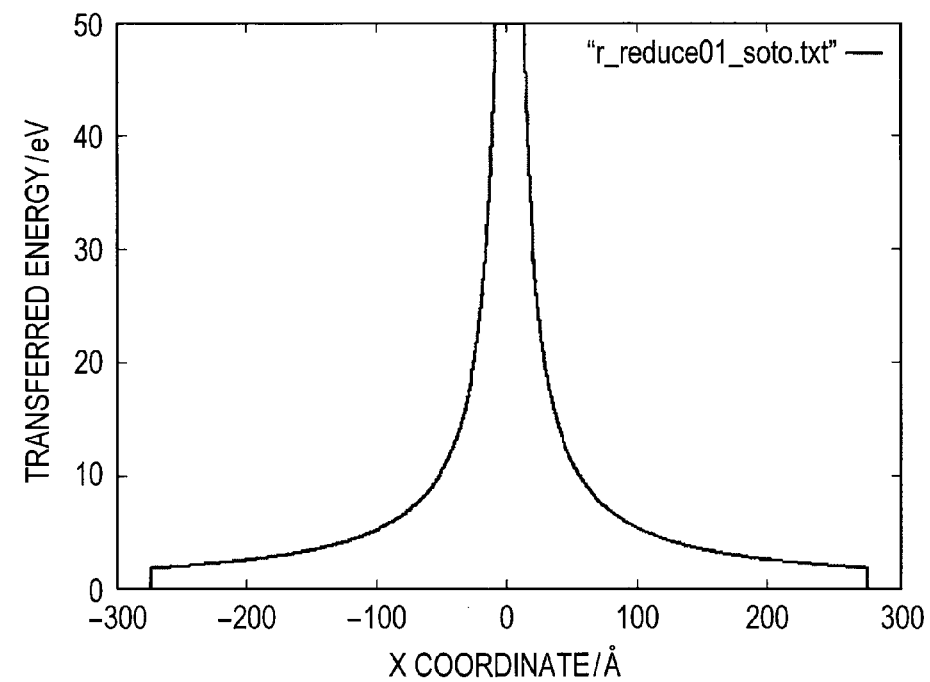
FIG. 14 is a cross section of the radial distribution function of the transferred energy with a cutoff on the outer circumference.

The desorbing region is defined by the steps illustrated in FIG. 9. The desorption energy depends on the molecule, but generally is greater than 0 eV and up to 10 eV with a typical value of 2.0 eV. FIG. 14 plots a cross-sectional profile of the function with cutting off the outer region which is smaller energy than the typical value. In this case, the value r is 275 Å.

Figure 15:
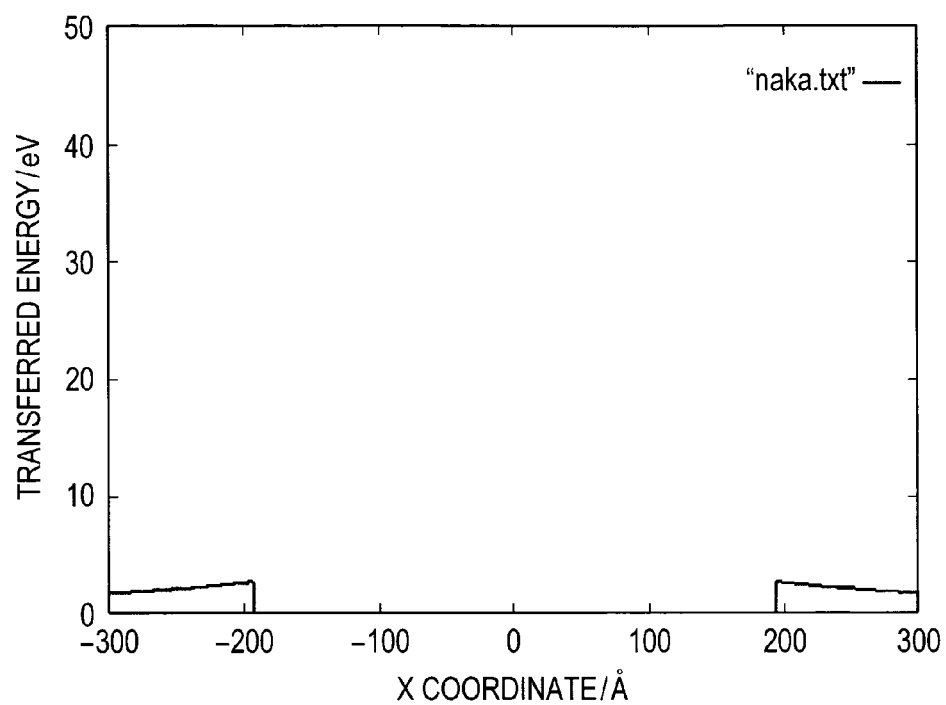
FIG. 15 is a cross section of the radial distribution function of the transferred energy with a cutoff on the inner circumference.

The fragmenting region is defined by the steps illustrated in FIG. 10. Insulin insulin contains C—H, N—H, O—H, C—N, and C—C bonds. Except the C—H, N—H, and O—H bonds, the smallest dissociation energy is the C—N bond and is 2.8 eV. FIG. 15 plots a cross-sectional profile of the function with cutting off the inner region which is higher than this value. When calculated using $E=f(r)=549/r$, the value r is about 200 Å.

Figure 16:
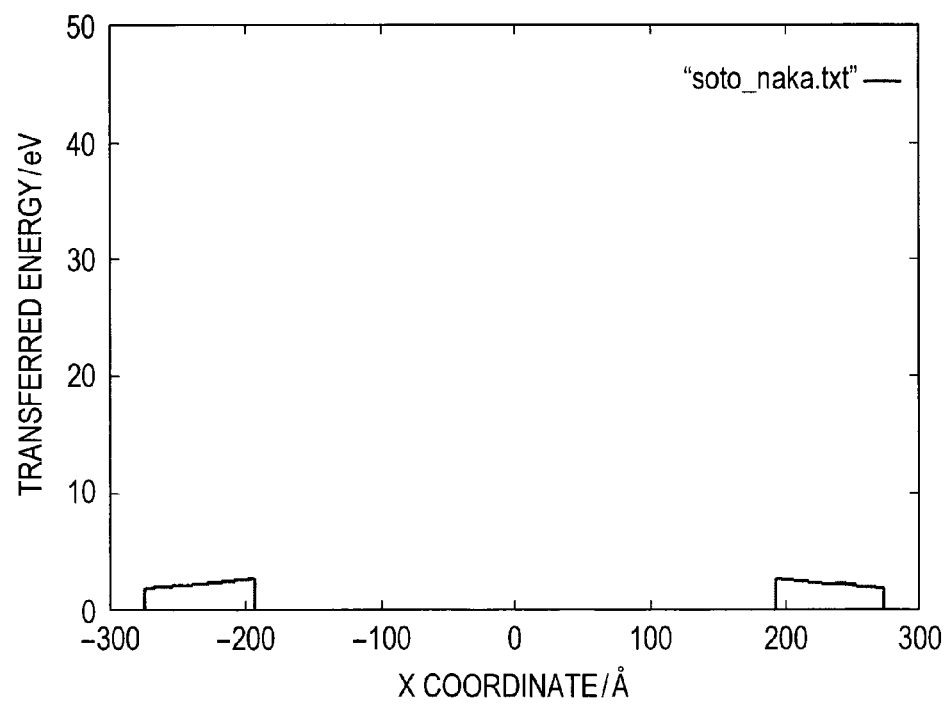
FIG. 16 is a cross section of the radial distribution function of the transferred energy with a cutoff on the outer and inner circumferences.
Figure 17:
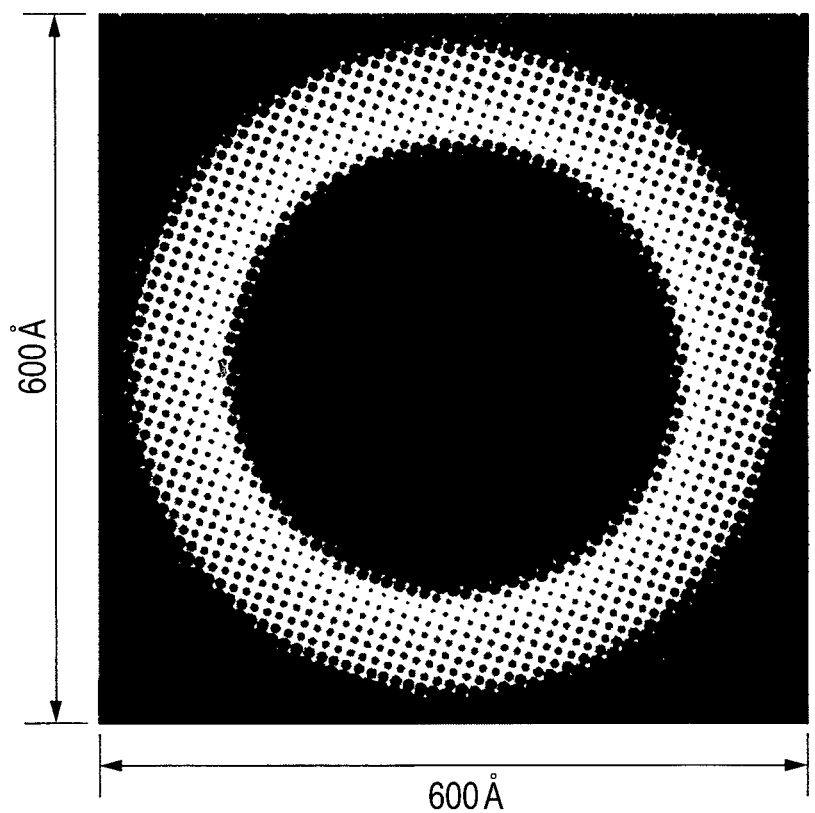
FIG. 17 illustrates the 2D distribution function of the transferred energy.

When the steps in FIGS. 9 and 10 are applied, a function with cutoff on the outer and inner sides is obtained. FIG. 16 plots the cross-sectional profile of this function and FIG. 17 illustrates the two-dimensional distribution of this one.

Figure 18:
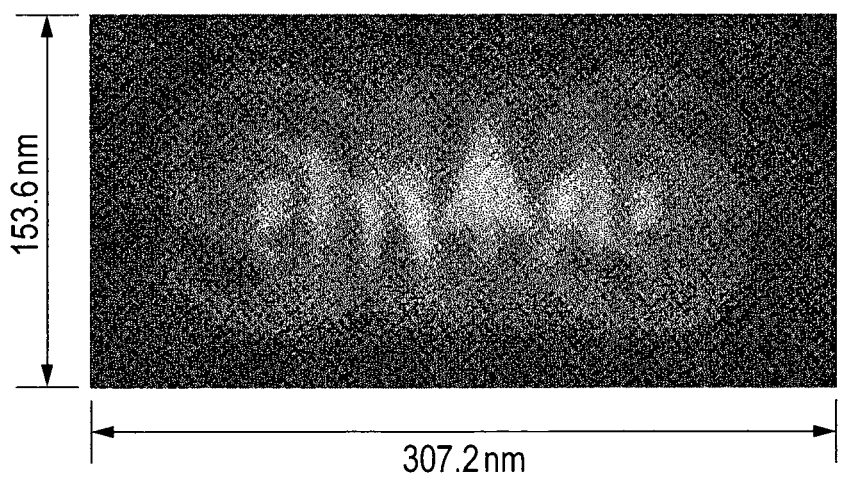
FIG. 18 illustrates a blurred image.

FIG. 18 illustrates a model image of a mass spectrum image acquired by TOF-SIMS. This image assumes an acquired one from molecule on Si substrate. The model image is 307.2 nm wide and 153.6 nm high (256×128 pixels). Image processing based on FIG. 4 is carried out using this model image.

Then, a blurring function is prepared to perform image restoration for reducing image blurring. As the blurring function for image processing, the above described 2D distribution function can be used.

The image processing is executed by the image processing software ImageJ developed by US National Institutes of Health (NIH). As a plugin for this processing, Parallel Iterative Deconvolution developed by Piotr Wendykier of Emory University is used.

FIG. 18 illustrates a blurred image, FIG. 19 illustrates a restored image after image restoration, and FIG. 20 illustrates the original image. It is understood that the restored image is clearer than the blurred image as a whole.

The similarity of the two images can be evaluated by calculating the cross-correlation coefficient R of the images. The two images A and B each having M×N pixels are compared as follows.

$$R = \frac{\sum_{k=0}^{M-1}\sum_{l=0}^{N-1}(A[k][l]-\bar{f})(B[k][l]-\bar{t})}{\sqrt{\sum_{k=0}^{M-1}\sum_{l=0}^{N-1}(A[k][l]-\bar{f})^2}\sqrt{\sum_{k=0}^{M-1}\sum_{l=0}^{N-1}(B[k][l]-\bar{t})^2}}$$ Math. 6

If each pixel value is not negative, the cross-correlation coefficient R in an image is OR1. The closer to 1 the value is, the higher the similarity is.

The image restoration effect is examined by calculating the cross-correlation coefficient R between the blurred image and the original image as well as between the restored image and the original image. The calculated results are illustrated in FIG. 21. The values of the cross-correlation coefficient are 0.55 and 0.73 respectively. It is understood that the restored image is closer to the original image. The above proves the effect of the blurring function estimated by the present invention.

Second Embodiment

Figure 22:
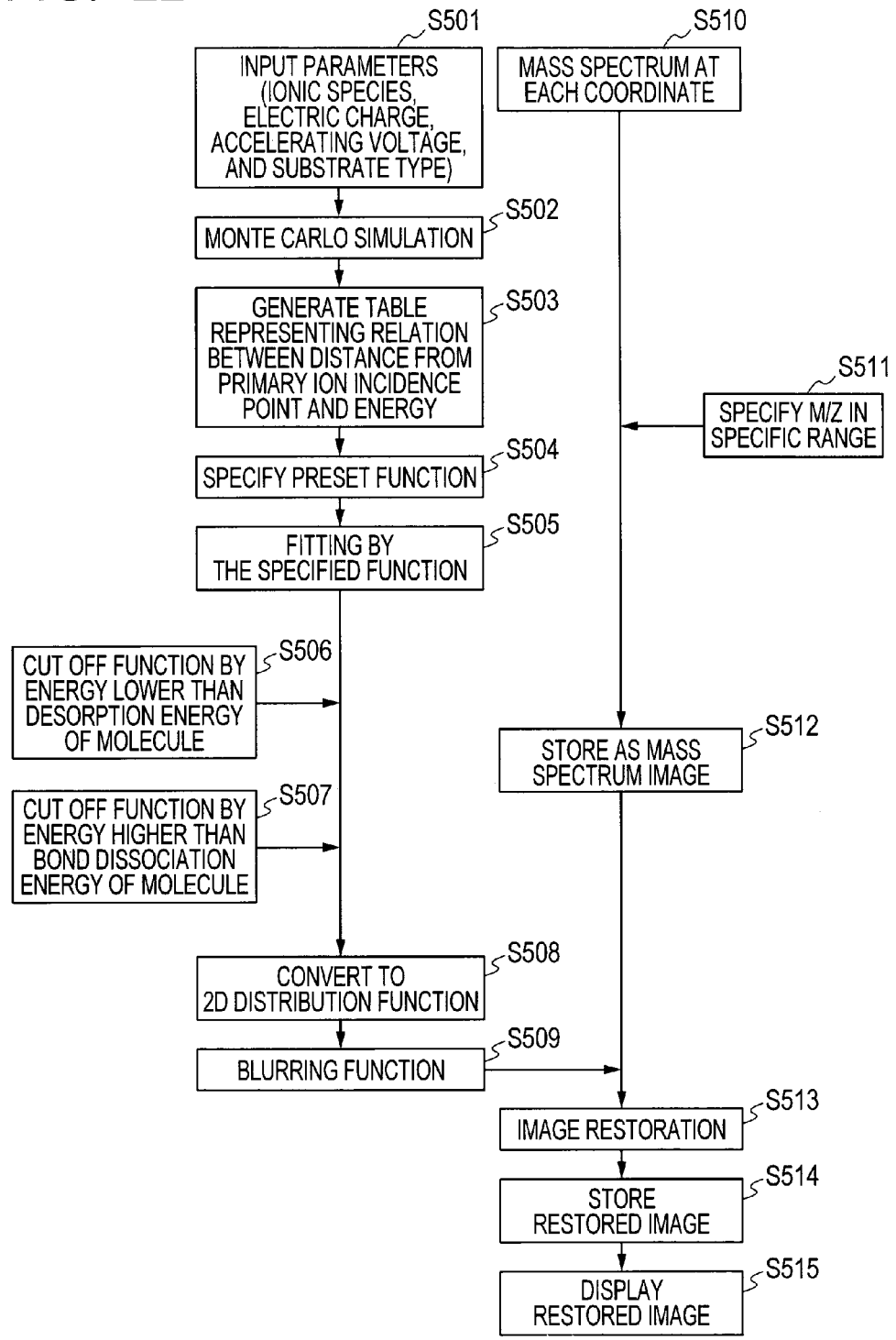
FIG. 22 illustrates a step of obtaining a blurring function for reducing blur of a mass spectrum image.

FIG. 22 illustrates a step of obtaining a blurring function for reducing blur of a mass spectrum image.

In step S501 of inputting the ionic species of a primary ion, an electric charge, an accelerating voltage, and a substrate type, the values thereof are inputted based on the observation conditions.

In step S502 of performing Monte Carlo simulation, the values inputted in step S501 are used as the parameters to perform Monte Carlo simulation on the collision between the incident primary ion and the substrate.

In step S503, a table representing the relation between the distance from the point of primary ion incidence and the transferred energy is generated from the simulated results.

In step S504 of specifying a preset function, the function is selected from among preset functions.

In step S505 of fitting by the specified function, the table representing the relation between the distance from the point of primary ion incidence and the transferred energy is used to fit the function and obtain the coefficient.

As the function for use in fitting, a better function is selected from among a plurality of preset functions while viewing the fitting results.

In step S506 of cutting off a function fitted by energy lower than the desorption energy, the function is cut off by the energy lower than the desorption energy of the molecule and the value is set to 0 according to the first embodiment.

In step S507 of cutting off a function fitted by energy higher than the bond dissociation energy, the function is cut off by the energy higher than the bond dissociation energy of the molecule and the value is set to 0 according to the first embodiment.

In step S508 of converting the fitted function to the 2D distribution function, the radial distribution is converted to the 2D distribution.

In step S509 of storing the 2D distribution function as the blurring function, the blurring function is stored for image restoration to be performed in subsequent step.

In step S511 of specifying m/z in a specific range, a specific m/z is inputted.

In step S512 of extracting a specified intensity of m/z from the mass spectrum at each coordinate and storing it as the mass spectrum image, a specified intensity of m/z is extracted from the mass spectrum at each coordinate S510 and stored as the mass spectrum image.

In step S513 of performing image restoration on the stored blurring function and the mass spectrum image, image restoration is performed using the stored blurring function and the mass spectrum image.

In step S514 of storing the obtained image, the results of image restoration are stored as the restored image.

In step S515 of displaying the restored image, it is shown on a display screen.

Third Embodiment

Figure 23:
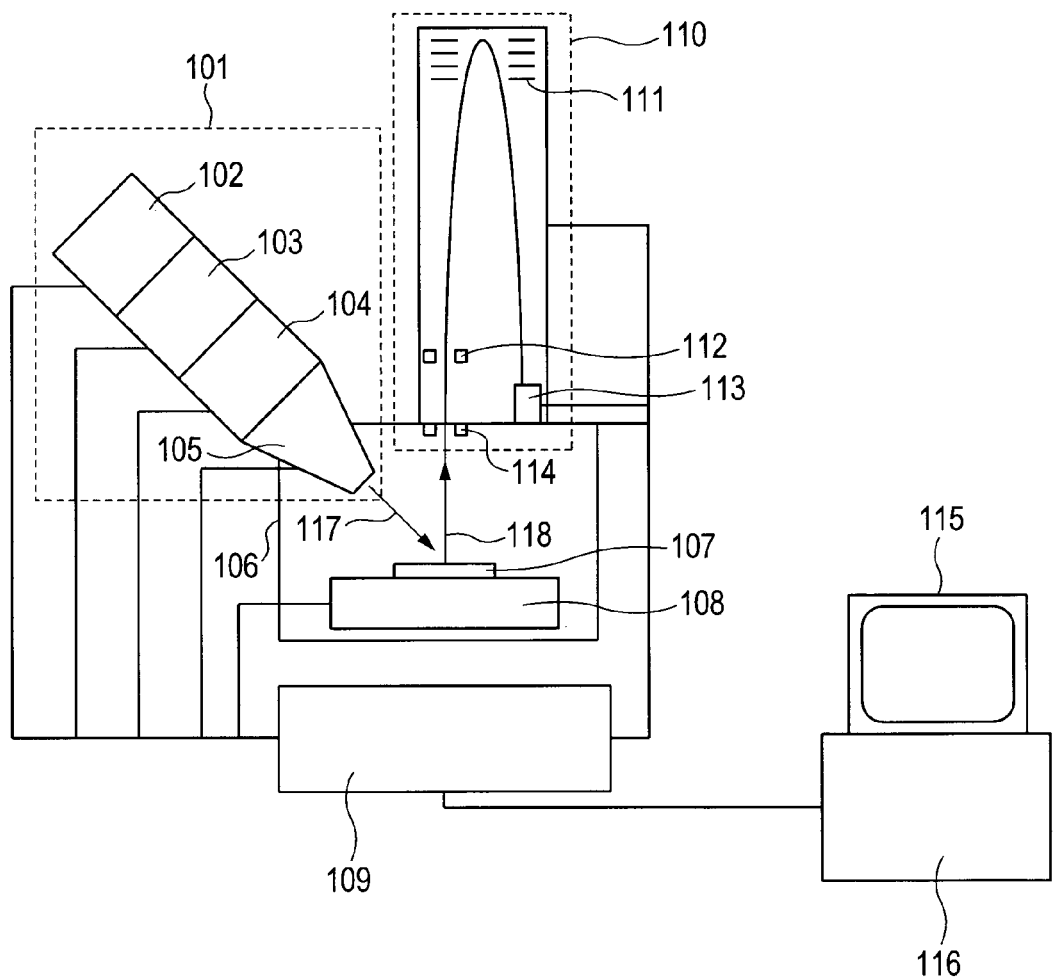
FIG. 23 illustrates a time-of-flight secondary ion mass spectrometer.

FIGS. 23 and 24 illustrate a time-of-flight secondary ion mass spectrometer having a primary ion irradiation unit 101 and a reflector detector 110 which are embodiments of the present invention.

The primary ion irradiation unit 101 includes an ion gun 102, a pulsing unit 103, a converging lens 104, and a scanning unit 105.

The reflector detector 110 includes an electrode 114 for guiding a secondary ion 118 into the detector; a lens 112 for converging the secondary ion onto a sensor; a reflector 111 for reflecting the secondary ion in a direction of the sensor; and a sensor 113 for detecting the secondary ion.

The configuration is made such that a sample 107 and a sample stage 108 in a vacuum chamber 106 can be irradiated with a primary ion 117, and the secondary ion 118 is guided into the detector 110. As the primary ion 117, gallium, cesium, bismuth cluster, and fullerene can be used. These primary ions 117 are generated and accelerated by the ion gun 102 in the primary ion irradiation unit 101.

The ionic species and the accelerating voltage are set based on the sample, the spatial resolution, and the mass/charge required for measurement.

The accelerating voltage is generally about 10 to 30 kV.

After the sample surface is irradiated with the primary ion 117, the secondary ion 118 is generated from the sample surface.

The secondary ion 118 enters the reflector detector 110 and is detected as a mass spectrum based on the difference in time to reach the sensor 113.

The secondary ion 118 is detected in this manner and recorded in a recording medium (memory or hard disk) in a computer 116 through an external control unit 109. Reference numeral 115 denotes a display.

The sample is irradiated with the primary ion 117 while changing the coordinate of the sample surface by the scanning unit 105. The mass spectrum at each coordinate is recorded in the recording medium in the computer.

The signal intensities for each mass/charge ratio from a collection of mass spectra recorded at each coordinate in the computer are two-dimensionally displayed as a mass spectrum image.

This image can be recorded in memory or a recording medium.

The external control unit 109 includes a control unit 201 for the ion irradiation unit, a control unit 202 for the reflector detector, a control unit 203 for the sample stage, and a counter 204 for counting the number of ions.

The external control unit 109 is controlled by a control unit 205 of the external control unit in the computer.

The number of ions obtained through the control unit 205 of the external control unit is stored in a storage apparatus as a mass spectrum at each coordinate 206.

In steps S510 to S512, the signal intensity vs mass/charge in a specific range is extracted from the spectrum at each coordinate 206 and recorded as a mass spectrum image 208 and also displayed.

The blurring function estimation 207 is executed in steps S501 to S508 and the result is used as a blurring function 209.

The blurring function 209 is used to perform image restoration on the mass spectrum image 208 and the restored image is stored as a mass spectrum image 210 with reduced blur and displayed on the display.

REFERENCE SIGNS LIST

1 Fitted radial distribution
2 Radial distribution cut off by desorption energy
3 Desorption energy
4 Position of primary ion incidence
5 Region in which a fragmented ion is desorbed
6 Region in which a molecule is ionized and desorbed with its molecular structure intact
7 Region in which a molecule is not desorbed as a secondary ion
8 Radial distribution function fitted by a linear function
9 Bond dissociation energy
10 Radial distribution function whose region is defined
11 Radial distribution function whose region is defined
101 Primary ion irradiation unit
102 Ion gun
103 Pulsing unit
104 Converging lens
105 Scanning unit
106 Vacuum chamber
107 Sample
108 Sample stage
109 External control unit
110 Reflector detector
111 Reflector
112 Lens
113 Sensor
114 Electrode
115 Display
116 Computer
205 Control unit
206 Mass spectrum at each coordinate
207 Blurring function estimation
208 Mass spectrum image
209 Blurring function
210 Mass spectrum image with reduced blur This application claims the benefit of Japanese Patent Application No. 2010-032365, filed Feb. 17, 2010, which is hereby incorporated by reference herein in its entirety.

The invention claimed is:

1. An image processing method for a mass spectrum image of secondary ion mass spectrometry, the method comprising using a computer to perform the steps of:
expressing transferred energy as a radial function related to a distance from a point of primary ion incidence;
expressing the radial function in a region exceeding desorption energy of a molecule as a 2D distribution function;
using the 2D distribution function as a blurring function; and
using the blurring function to reduce image blurring of the mass spectrum image.

2. The image processing method for the mass spectrum image according to claim 1, wherein the radial function is a linear fractional function, a log-normal function, a log function, a pulse function, or a Lorentz function.

3. The image processing method for the mass spectrum image according to claim 1, wherein the 2D distribution function is a function related to x and y, and can be obtained by assigning $a/(x^2+y^2)^{n/2}$ (a is a constant greater than 0 and n is a constant equal to or greater than 0.8 and equal to or less than 1.2) to a distance of the radial distribution function from its incidence point.

4. The image processing method according to claim 1, wherein the radial function in a region exceeding the desorption energy of the molecule in a sample subject to the primary ion incidence and excluding a transferred energy portion larger than the bond dissociation energy of a bond of the molecule in the sample is expressed as the 2D distribution function and this 2D distribution function is used as the blurring function.

5. A computer-readable medium storing a program for causing a computer to execute:
a first step of inputting data representing an ionic species of a primary ion, an electric charge, an accelerating voltage, and a substrate type;
a second step of executing Monte Carlo simulation based on a parameter inputted in the first step;
a third step of generating a table representing a relationship between a distance from a point of primary ion incidence and transferred energy from a result obtained in the second step;
a fourth step of specifying a preset function;
a fifth step of fitting the distance and the transferred energy obtained in the third step by the function specified in the fourth step;
a sixth step of cutting off a function fitted by energy lower than desorption energy of a molecule;
a seventh step of cutting off a function fitted by energy higher than bond dissociation energy of the sample molecule;
an eighth step of converting the fitted function obtained in the fifth step to a 2D distribution function;
a ninth step of storing the 2D distribution function obtained in the eighth step as a blurring function;
a tenth step of obtaining a mass spectrum at each coordinate;
an eleventh step of specifying m/z in a specific range;
a twelfth step of extracting a specified intensity of m/z from the mass spectrum at each coordinate and storing the intensity as a mass spectrum image;
a thirteenth step of performing image restoration on the blurring function stored in the ninth step and the mass spectrum image stored in the twelfth step;
a fourteenth step of storing the restored image obtained in the thirteenth step; and
a fifteenth step of displaying the restored image stored in the fourteenth step.

6. A secondary ion mass spectrometer in which the program according to claim 5 is installed.

7. An image processing method for a mass spectrum image of secondary ion mass spectrometry, the method comprising using a computer to perform the steps of:
obtaining transferred energy as a radial function related to a distance from a point of primary ion incidence;

obtaining the radial function in a region exceeding desorption energy of a molecule as a 2D distribution function;

using the 2D distribution function as a blurring function; and using the blurring function to reduce image blurring of the mass spectrum image.

8. The image processing method for the mass spectrum image according to claim 7, wherein the radial function is a linear fractional function, a log-normal function, a log function, a pulse function, or a Lorentz function.

9. The image processing method for the mass spectrum image according to claim 7, wherein the 2D distribution function is a function related to x and y, and can be obtained by assigning $a/(x^2+y^2)^{n/2}$ (a is a constant greater than 0 and n is a constant equal to or greater than 0.8 and equal to or less than 1.2) to a distance of the radial distribution function from its incidence point.

10. The image processing method according to claim 7, wherein the radial function in a region exceeding the desorption energy of the molecule in a sample subject to the primary ion incidence and excluding a transferred energy portion larger than the bond dissociation energy of a bond of the molecule in the sample is expressed as the 2D distribution function and this 2D distribution function is used as the blurring function.

11. An image processing method for a mass spectrum image of secondary ion mass spectrometry, the method comprising using a computer to perform the steps of:

reducing image blurring of the mass spectrum image using a blurring function as a 2D distribution function, wherein the blurring function is obtained by obtaining transferred energy as a radial function related to a distance from a point of primary ion incidence, and wherein the radial function is obtained in a region exceeding desorption energy of a molecule as the 2D distribution function.

12. The image processing method for the mass spectrum image according to claim 11, wherein the radial function is a linear fractional function, a log-normal function, a log function, a pulse function, or a Lorentz function.

13. The image processing method for the mass spectrum image according to claim 11, wherein the 2D distribution function is a function related to x and y, and can be obtained by assigning $a/(x^2+y^2)^{n/2}$ (a is a constant greater than 0 and n is a constant equal to or greater than 0.8 and equal to or less than 1.2) to a distance of the radial distribution function from its incidence point.

14. The image processing method according to claim 11, wherein the radial function in a region exceeding the desorption energy of the molecule in a sample subject to the primary ion incidence and excluding a transferred energy portion larger than the bond dissociation energy of a bond of the molecule in the sample is expressed as the 2D distribution function and this 2D distribution function is used as the blurring function.

* * * * *